United States Patent
Ji et al.

(10) Patent No.: US 8,158,512 B2
(45) Date of Patent: *Apr. 17, 2012

(54) ATOMIC LAYER DEPOSITION METHOD AND SEMICONDUCTOR DEVICE FORMED BY THE SAME

(75) Inventors: Hua Ji, Shanghai (CN); Min-Hwa Chi, Shanghai (CN); Fumitake Mieno, Shanghai (CN); Sean Fuxiong Zhang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 916 days.

This patent is subject to a terminal disclaimer.

(21) Appl. No.: 12/141,040

(22) Filed: Jun. 17, 2008

(65) Prior Publication Data
US 2008/0315292 A1   Dec. 25, 2008

(30) Foreign Application Priority Data
Jun. 22, 2007 (CN) .......................... 2007 1 0042461

(51) Int. Cl.
*H01L 21/203* (2006.01)
(52) U.S. Cl. ........ 438/658; 438/287; 438/591; 438/593; 438/681; 257/E21.019; 257/E21.021
(58) Field of Classification Search .................. 438/658, 438/681, 593, 590, 591, 287; 257/E21.019, 257/E21.021
See application file for complete search history.

(56) References Cited

U.S. PATENT DOCUMENTS
2007/0057292 A1* 3/2007 Park et al. ...................... 257/213
2008/0009115 A1* 1/2008 Willer et al. .................. 438/257
* cited by examiner

*Primary Examiner* — Minchul Yang
(74) *Attorney, Agent, or Firm* — Squire Sanders (US) LLP

(57) ABSTRACT

There is provided a method of manufacturing a semiconductor device, including the following steps: flowing a first precursor gas to the semiconductor substrate within a ALD chamber to form a first discrete monolayer on the semiconductor substrate; flowing an inert purge gas to the semiconductor substrate within the ALD chamber; flowing a second precursor gas to the ALD chamber to react with the first precursor gas which has formed the first monolayer, thereby forming a first discrete compound monolayer; and flowing an inert purge gas; forming a first dielectric layer to cover the discrete compound monolayer; forming a second third monolayer above first dielectric layer; and forming a second discrete compound monolayer; and forming a second dielectric layer to cover the second discrete compound monolayer above the first dielectric layer. There is also provided a semiconductor device formed by the ALD method.

16 Claims, 9 Drawing Sheets

ATOMIC LAYER DEPOSITION METHOD AND SEMICONDUCTOR DEVICE FORMED BY THE SAME

FIELD OF THE INVENTION

The present invention relates to a method for manufacturing a semiconductor, and more particularly, to an atomic layer deposition method and a semiconductor device manufactured by the same.

DESCRIPTION OF THE RELATED ART

Atomic layer deposition (ALD) is originally referred to as Atomic Layer Epitaxy (ALE), and is also termed as Atomic Layer Chemical Vapor Deposition (ALCVD).

Atomic layer deposition involves the successive deposition of a plurality of monolayers over a semiconductor substrate within a deposition chamber typically maintained at a negative pressure (sub-atmospheric pressure). An exemplary method is disclosed in the background art of Chinese application No. 03818269, which comprising the following steps: feeding a first vaporized precursor into a deposition chamber to ly form a first monolayer 110 on the semiconductor substrate 100 placed in the deposition chamber, as shown in FIG. 1; thereafter, ceasing the flow of the first vaporized precursor, and flowing an inert purge gas through the chamber to remove all remaining first precursor which is not adhering to the semiconductor substrate 100 from the chamber, as shown in FIG. 2; Subsequently, flowing a second vaporized precursor which is different from the first precursor into the deposition chamber to form a second monolayer 120 on/with the first monolayer 110, the second monolayer 120 can react with the first monolayer 110, as shown in FIG. 3; and ceasing the flow of the second precursor, and flowing an inert purge gas through the chamber to remove all remaining second monolayer 120 which is not adhering to the first layer 110, as shown in FIG. 4. The deposition process for the first and the second monolayer can be repeated until the layer having a desired thickness and composition has been formed on the semiconductor substrate.

However, the above atomic layer composed of the first monolayer and the second monolayer and formed on a semiconductor substrate by ALD process is a continuous distributing layer, and is mainly applied in hole and trench with a high line width and aspect ratio in a conventional process for manufacturing semiconductor.

With the development of the processes for manufacturing a semiconductor device, the critical dimension of semiconductor devices becomes smaller and the requirement for the storage density of semiconductor devices becomes higher. In a process for manufacturing a semiconductor device with a three-layer stack structure of medium layer-charge trapping layer-medium layer, the use of a charge trapping layer of discrete atomic islands (nano-dot) instead of a charge trapping layer having a certain thickness in the prior art can decrease the lateral current leakage, reduce the thickness of the charge trapping layer, and improve the storage capability of the semiconductor device. However, in the prior art, the charge trapping layer of discrete atomic islands (nano-dot) is generally formed by chemical vapor deposition or physical vapor deposition, and the size of the resulting atomic islands is in a range of 10 nm~100 nm, and the size distribution of the atomic islands is non-uniform.

SUMMARY OF THE INVENTION

To resolve the above-mentioned problem, the present invention provides an atomic layer deposition method to form one or more compound monolayers with discrete distribution.

The present invention further provides a semiconductor device with a three-layer stack structure of medium layer-charge trapping layer-medium layer, wherein the compound monolayers contained in the charge trapping layer are all at atomic level and have an uniform size distribution.

In an aspect according to the present invention, there is provided an atomic layer deposition method comprising the steps of:

placing a semiconductor substrate in an atomic layer deposition chamber;

flowing a first precursor gas to the semiconductor substrate within the atomic layer deposition chamber to form a first discrete monolayer on the semiconductor substrate;

flowing an inert purge gas to the semiconductor substrate within the atomic layer deposition chamber to remove the first precursor gas which does not form the first monolayer;

flowing a second precursor gas into the atomic layer deposition chamber to react with the first precursor gas which forms the first monolayer, thereby forming a first discrete compound monolayer; and flowing an inert purge gas to the semiconductor substrate within the atomic layer deposition chamber to remove the second precursor gas that does not react with the first precursor gas and the reaction byproduct between the first and the second precursor gases;

forming a first dielectric layer to cover the first compound monolayers above the semiconductor substrate;

flowing a third precursor gas into the atomic layer deposition chamber to form a third discrete monolayer above the first dielectric layer;

flowing the inert purge gas into the atomic layer deposition chamber to remove the third precursor gas that does not form the third monolayer with the first dielectric layer;

flowing a forth precursor gas into the atomic layer deposition chamber to react with the third precursor gas that has formed the third monolayer, thereby forming a second discrete compound monolayer;

flowing the inert purge gas into the atomic layer deposition chamber to remove the forth precursor gas that does not react with the third monolayer and the reaction byproduct between the third and the forth precursor gases; and forming a second dielectric layer to cover the second compound monolayers above the first dielectric layer.

In another aspect according to the present invention, there is provided a semiconductor device comprising a semiconductor substrate, a three-layer stack structure of medium layer-charge trapping layer-medium layer disposed above the semiconductor substrate, a gate disposed above the three-layer stack structure, and a source and a drain disposed in the semiconductor substrate at either side of the three-layer stack structure. The charge trapping layer is a dielectric layer containing one or more discrete compound monolayers formed by ALD method.

The invention, compared with the prior art, has the following advantages:

1. The present invention provides an atomic layer deposition method, by which a first discrete compound monolayer is formed after forming a first discrete monolayer above a semiconductor substrate, and a first dielectric layer is formed on the first discrete compound monolayer, followed by forming a second discrete compound monolayer above the first dielectric layer, thereby forming one or more discrete compound monolayers above the semiconductor substrate and achieving a multi-layer discrete distribution of the atomic size nano-dots above the semiconductor substrate. Furthermore, with the ALD process, the sizes of the formed discrete compound monolayers are of precise atomic level and are uniform. The compound monolayers, when applied into the semiconductor device such as memory, can improve the storage capability and memory isolation capability, and decrease the current leakage.

Further, in the atomic layer deposition method, a first discrete monolayer is formed on a semiconductor substrate by controlling the process of flowing the first precursor gas to the deposition chamber, and the distribution density of the first monolayer on the semiconductor substrate is adjusted by controlling the flow rate and time for the precursor gas flowing to the deposition chamber, thereby forming a first discrete compound monolayer; and a first dielectric layer covering the first discrete compound monolayer is formed on the first discrete compound monolayer, followed by forming a third monolayer on the first dielectric layer through controlling the process of flowing the third precursor gas to the deposition chamber; the distribution density of the third monolayer on the first dielectric layer and of the first monolayer and the third monolayer on the semiconductor substrate are controlled by adjusting the flow rate and time for the third precursor gas flowing to the deposition chamber.

2. The present invention further provides a semiconductor device which comprises a three-layer stack structure of medium layer-charge trapping layer-medium layer, the charge trapping layer is a dielectric layer containing one or more discrete compound monolayers, and the sizes of the discrete compound monolayers are at atomic level and are controllable. Furthermore, the distribution densities of the discrete compound monolayers in the dielectric layer can be adjusted by controlling the flow rate and time for the reaction gas flowing to the deposition chamber during the atomic layer deposition process.

SPECIFIC EMBODIMENTS OF THE INVENTION

An object of the present invention is to provide an atomic layer deposition method by which one or more discrete nano-dots are formed on a semiconductor substrate, wherein the sizes and thicknesses of the nano-dots are at atomic level, and the number thereof is controllable.

Another object of the present invention is to provide a semiconductor device with a three-layer stack structure of medium layer-charge trapping layer-medium layer, wherein the charge trapping layer is a dielectric layer containing one or more discrete nano-dots formed by atomic layer deposition method.

The above objects, features and advantages of the present invention will become better understood with respect to the following description of the preferred embodiments given in conjunction with the accompanying drawings.

First Embodiment

Figure 19:
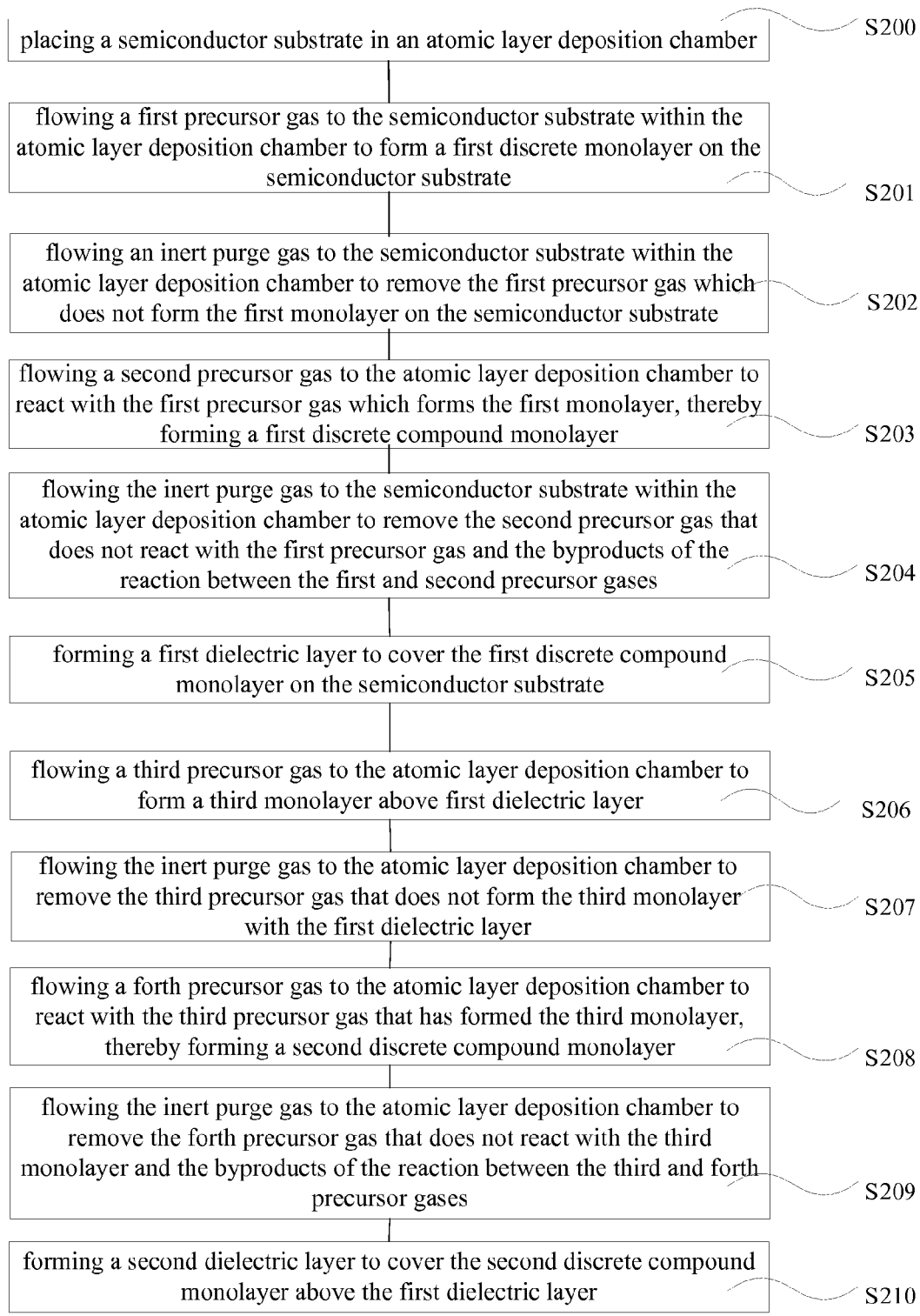
FIG. 19 is a flow diagram illustrating the atomic layer deposition process according to the first embodiment of the present invention.

An atomic layer deposition method is provided in this embodiment. Referring to the flow diagram shown in FIG. 19, the method comprises the following steps: step S200, placing a semiconductor substrate in an atomic layer deposition chamber; step S201, flowing a first precursor gas to the semiconductor substrate within the atomic layer deposition chamber to form a first discrete monolayer on the semiconductor substrate; step S202, flowing an inert purge gas to the semiconductor substrate within the atomic layer deposition chamber to remove the first precursor gas which does not form the first monolayer on the semiconductor substrate; step S203, flowing a second precursor gas into the atomic layer deposition chamber to react with the first precursor gas which has formed the first monolayer to form a first discrete compound monolayer; step S204, flowing an inert purge gas into the deposition chamber to remove the second precursor gas that does not react with the first precursor gas and the reaction byproducts between the first and the second precursor gases; step S205, forming a first dielectric layer to cover the first compound monolayer above the semiconductor substrate; step S206, flowing a third precursor gas into the atomic layer deposition chamber to form a third monolayer on the first dielectric layer; step S207, flowing the inert purge gas into the atomic layer deposition chamber to remove the third precursor gas that does not form the third monolayer with the first dielectric layer; step S208, flowing a forth precursor gas into the atomic layer deposition chamber to react with the third precursor gas that has formed the third monolayer, thereby forming a second discrete compound monolayer; step S209, flowing the inert purge gas into the atomic layer deposition chamber to remove the forth precursor gas that does not react with the third monolayer and the reaction byproducts between the third and the forth precursor gases; and step S210, forming a second dielectric layer to cover the second compound monolayer above the first dielectric layer.

Firstly, referring to the step 200, a semiconductor substrate 200 is placed in an atomic layer deposition chamber. The deposition chamber is a deposition chamber of conventional reaction apparatus for atomic layer deposition in accordance with the prior art. In order to distribute the reaction gases on the semiconductor substrate as uniformly as possible during atomic layer deposition process, the reaction gas inlet device of the deposition apparatus is preferably configured to enable gases to flow into the deposition chamber uniformly from various directions, for example, a shower head type inlet device can be employed to allow the distribution of discrete dots formed on the semiconductor substrate more uniformly.

The semiconductor substrate 200 can be made of various semiconductor materials known to those skilled in the art, including silicon or silicon germanium (SiGe) with monocrystal or polycrystal structures, ion-doped Si or SiGe such as N-doped or P-doped Si or SiGe, compound semiconductor such as silicon carbide, indium antimonide, lead telluride, indium arsenide, indium phosphide, gallium arsenide or gallium telluride, alloy semiconductor or combinations thereof, and silicon-on-insulator (SOI). The semiconductor substrate can be a blank semiconductor substrate, or a semiconductor substrate provided with various semiconductor devices and wirings therein.

Figure 1:
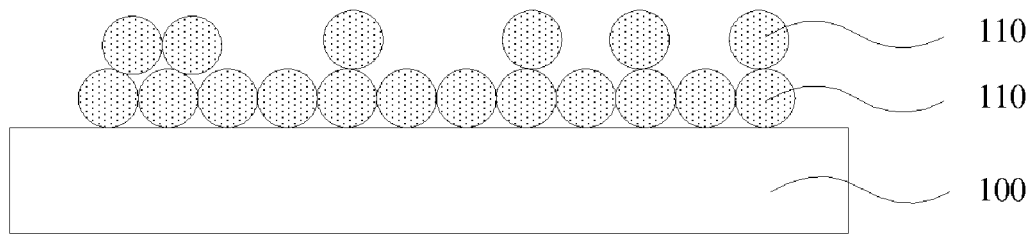
FIGS. 1 to 4 are schematic views illustrating an atomic layer deposition process according to the prior art.
Figure 2:
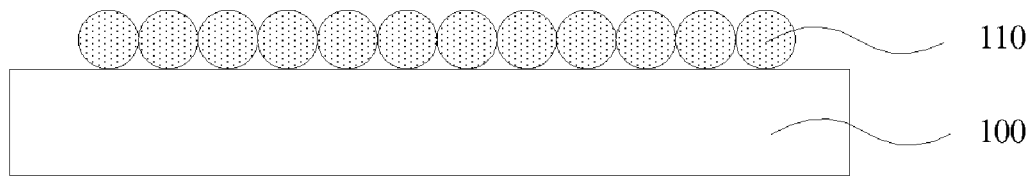
Figure 3:
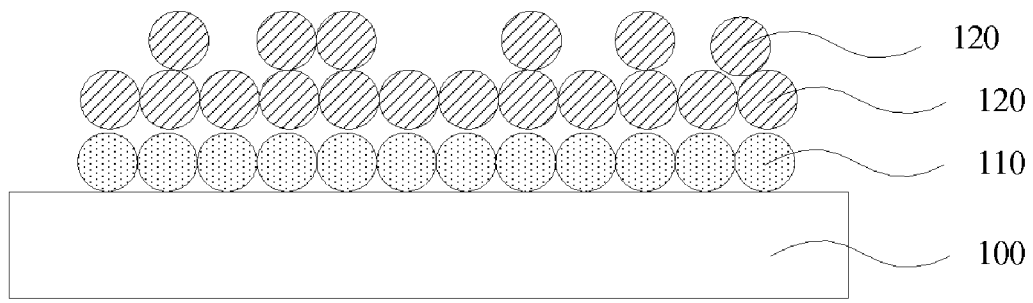
Figure 4:
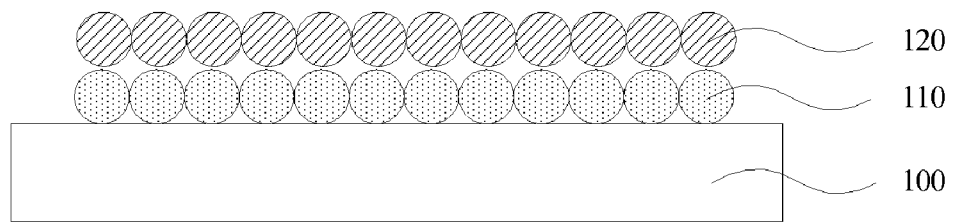
Figure 5:
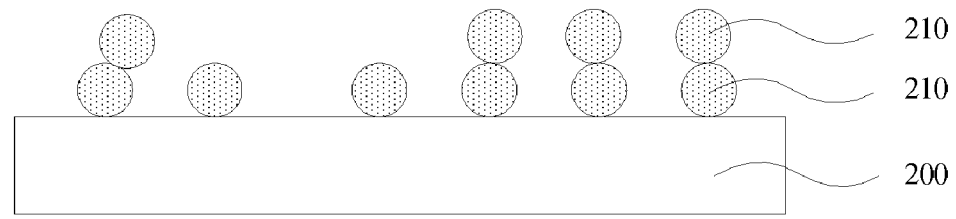
FIGS. 5 to 18 are schematic drawing illustrating an atomic layer deposition process according to a first embodiment of the present invention.

Referring to the step S201, a first precursor gas flows to a semiconductor substrate 200 in an atomic layer deposition chamber, as shown in FIG. 5, and a first discrete monolayer 210 is formed on the semiconductor substrate 200 due to the physical or chemical adsorption between the first precursor gas and the semiconductor substrate. There is also adsorbed the atoms of the first precursor gas on the first monolayer 210 which is directly contacted with the semiconductor substrate 200 due to the mutual adsorption between the atoms of the first precursor gas each other.

The first precursor gas can be any of reaction gases having nucleation matter and capable of forming the first monolayer 210 on the semiconductor substrate 200 via chemical or physical adsorption. It can be selected from one or more of metal materials, semi-conductive materials, or metals coordinated with halogen and organic complex, or semiconductors coordinated with halogen and organic complex or mixtures thereof, for example, the metal materials include Ta, Ti, W, Mo, Nb, Cu, Ni, Pt, Ru, Me, Ni and Al etc., the semi-conductive materials include silicon etc., and the semiconductors coordinated with halogen and organic complex includes $SiCl_2H_2$, $Si(OC_2H_5)_4$, $SiH_2[NH(C_4H_9)]_2$, and $SiH(OC_2H_5)_3$, etc.

As an illustrative example, the embodiment provides several particular first precursor gases for well understanding and implementing the invention by those skilled in the art. If the final first discrete compound monolayer to be formed is $Si_3N_4$ layer, the first precursor gas is a reaction gas with Si atom nucleation matter, such as $SiCl_2H_2$, $SiH_4$, $Si_2Cl_6$ or $SiH_2[NH(C_4H_9)]_2$, etc.

If the final first discrete compound monolayer to be formed is HfO layer, the first precursor gas is a reaction gas with Hf atom nucleation matter, such as $Hf[N(CH_3)(C_2H_5)]_4$, $Hf[N(C_2H_5)_2]_4$, $Hf[OC(CH_3)_3]_4$, or $HfCl_4$, etc.

If the final first discrete compound monolayer to be formed is $Al_2O_3$ layer, the first precursor gas is a reaction gas with Al atom nucleation matter, such as $Al(CH_3)_3$, etc.

If the final first discrete compound monolayer to be formed is WN layer, the first precursor gas is a reaction gas with W atom nucleation matter, such as $WF_6$, etc.

In order to allow the first precursor gas to form the first discrete monolayer on the semiconductor substrate, the specific process conditions of the first precursor gas flowing to the deposition chamber should be controlled. The conditions controlling the discrete distribution of the first precursor gas on the semiconductor substrate include the gas flow rate, flowing time, flowing temperature, and pressure, etc. of the first precursor gas flowing into the atomic layer deposition chamber.

In this embodiment, the flow rate and flowing time of the first precursor gas flowing to the deposition chamber play a key role in achieving a discrete distribution. In order to allow the first precursor gas to form the first discrete monolayer on the semiconductor substrate, the flow rate and flowing time of the first precursor gas flowing to the deposition chamber should be reduced on the basis of the process of forming a dense first monolayer in prior art, and the flowing of the first precursor gas is ceased before the first precursor gas adsorbed on the semiconductor substrate forms a dense and continuous distribution layer. In a preferred example, the flow rate of the first precursor gas in the deposition chamber is greatly decreased while the flowing time is properly increased, thereby improving the controllability of the process.

In this embodiment, the distribution density of the first precursor gas which forms the first monolayer on the semiconductor substrate can be controlled by controlling the flow rate and flowing time of the first precursor gas flowing to the atomic layer deposition chamber.

In the prior art, as to different first precursor gases, the flow rate and flowing time required for forming a dense first monolayer on the semiconductor substrate are different; similarly, in the embodiment of present invention, as to different first precursor gases, the flow rate and flowing time required for forming a first discrete monolayer on the semiconductor substrate are different. However, the process of forming a first discrete monolayer according to the present invention is based on the process of forming a dense first monolayer in the prior art and is performed by reducing the flow rate and flowing time of the first precursor gas. In the process of forming a first discrete monolayer according to the present invention, the first monolayer with a discrete distribution can be formed depending on the requirement of process design, and the distribution density of the first precursor gas for forming the first discrete monolayer is controllable.

In the embodiment, there is provided a particular example for implementing the invention by the skilled in the art. If the final first discrete compound monolayer to be formed is $Si_3N_4$, the first precursor gas $SiCl_2H_2$ is flowed into a conventional deposition apparatus, at a flow rate of 0.06~0.3 slm and for 0~10 sec, preferably 0~7 sec. The pressure under which the first precursor gas flows into the deposition chamber is 500-800 Pa, and the temperature in the deposition chamber is in a range of 450-600° C., preferably 550° C.

In another particular example, if the discrete first compound monolayer to be formed finally is $Al_2O_3$, nitrogen gas carrying the liquid of $Al(CH_3)_3$ is flowed into a conventional atomic layer deposition apparatus as the first precursor gas, wherein the temperature of the nitrogen gas is 25° C., the flow rate of nitrogen gas is 0.03-0.15 slm, and the flowing time is more than 0, but less than 10 sec, preferably more than 0, but less than 7 sec. The pressure under which the first precursor gas flows into the deposition chamber is in a range of 3-5 Pa, and the temperature in the deposition chamber is in a range of 250-450° C., preferably 400° C.

Figure 6:
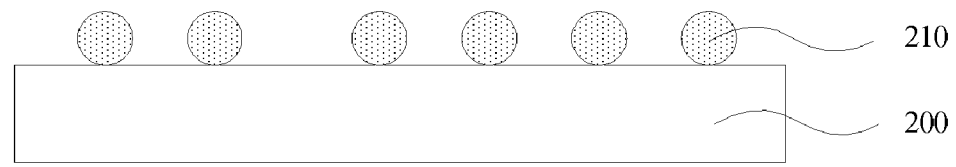

In the step S202, as shown in FIG. 6, an inert purge gas flows to the semiconductor substrate 200 in an atomic layer deposition chamber to remove the first precursor gas that does not form the first monolayer 210 on the semiconductor substrate 200. In this embodiment, the flowing to the semiconductor substrate in the atomic layer deposition chamber only represents the gas flow direction, and does not mean that the gas always contacts the semiconductor substrate directly or reacts with the same, since the other monolayer or dielectric layer has been formed on the semiconductor substrate after the step 202 of this embodiment. In this step, only the first precursor gas directly contacting the semiconductor substrate 200 is remained to form the first monolayer of the first precursor gas atom on the semiconductor substrate 200, and the other first precursor gas which is not adsorbed on the semiconductor substrate 200 directly is removed. The inert gas includes He, Ne, Ar, and the like.

After purging by the inert gas, an uniform or non-uniform first monolayer is formed on the semiconductor substrate with a discrete distribution at atomic level.

The purging of the inert gas can be performed according to any of the conventional processes in the prior art. There is provided a particular example for implementing the invention by the skilled in the art, for example, nitrogen ($N_2$) gas flows into and purges the deposition chamber at a flow rate of 5 slm under a pressure of 0.3 Torr.

Figure 7:
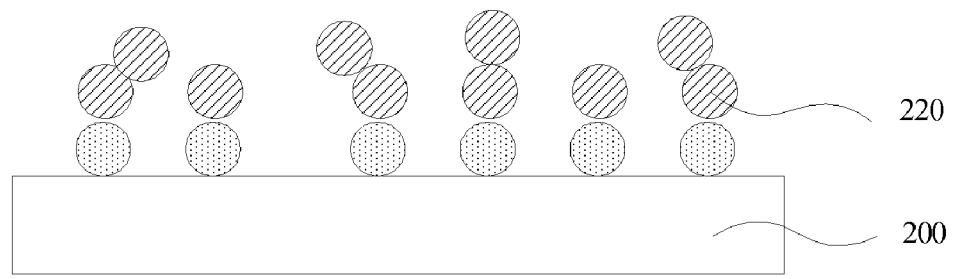

In step S203, a second precursor gas flows to the semiconductor substrate in an atomic layer deposition chamber, and reacts with the first precursor gas which forms the first monolayer, thereby forming a discrete compound monolayer. As shown in FIG. 7, the second precursor gas flows to the semiconductor substrate in the deposition chamber, and reacts with the first precursor gas to form a discrete compound monolayer 220. At the same time, due to the adsorption force between atoms, the second precursor gas can be adsorbed on the semiconductor substrate 200, and the atoms of the second precursor gas can adsorb each other. Due to the chemical reaction between the second precursor gas and the first precursor gas, byproducts may be generated from the reaction between the second precursor gas and the first precursor gas in the deposition chamber.

Depending on the first discrete compound monolayer to be formed and the first precursor gas, the second precursor gas can be any of the conventional substances in the prior art that can react with the first precursor gas to generate the discrete compound monolayer.

In a particular example, the second precursor gas is a material containing N or O or metal atoms and is used as a reductant or oxidant, such as $NH_3$ or $O_2$.

As an illustrative example only, the embodiment provides several particular second precursor gases for well understanding and implementing the invention by the skilled in the art. If the final first discrete compound monolayer to be formed is $Si_3N_4$, the first precursor gas is a reaction gas having Si atom nucleation matter, and the second precursor gas is the gas that can react with the nucleation matter of the first monolayer formed by the first precursor gas to form a discrete compound monolayer, such as $NH_3$, $N_2O$, and $N_2$ and the like.

If the final first discrete compound monolayer to be formed is HfO, the first precursor gas is a reaction gas having Hf atom nucleation matter, and the second precursor gas can be the gas that can react with the nucleation matter of the first monolayer formed by the first precursor gas to form a discrete compound monolayer, such as $O_3$ and the like.

If the final first discrete compound monolayer to be formed is $Al_2O_3$, the first precursor gas is a reaction gas having Al atom nucleation matter, and the second precursor gas can be the gas that can react with the nucleation matter of the first monolayer formed by the first precursor gas to form a discrete compound monolayer, such as $H_2O$ or $O_3$ and the like.

If the final first discrete compound monolayer to be formed is WN, the first precursor gas is a reaction gas having W atom nucleation matter, and the second precursor gas can be, for example, $NH_3$ and the like.

The process of flowing the second precursor gas into the semiconductor substrate in the deposition chamber can be performed by any conventional techniques known to the skilled in the art. For example, when the first precursor gas is $SiCl_2H_2$ and the discrete compound monolayer is $Si_3N_4$, $NH_3$ is used as the second precursor gas and injected into a conventional atomic layer deposition apparatus in the prior art at a flow rate of 2-5 slm for 0-30 sec, while the pressure in the deposition chamber is 30-50 Pa, and the temperature in the deposition chamber is 450-600° C., preferably 550° C.

Figure 8:
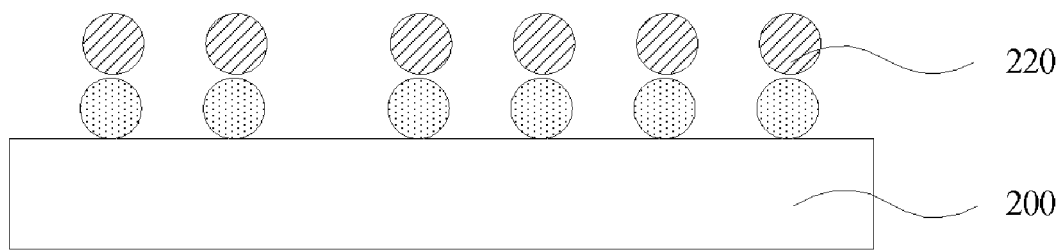

In the step S204, as shown in FIG. 8, an inert purge gas flows to the semiconductor substrate in the deposition chamber to remove the second precursor gas that does not react with the first precursor gas and the by product of the reaction between the first precursor gas and the second precursor gas.

The inert gas can be He, Ne, Ar and the like.

The process conditions for the purging of the inert gas can be achieved through conventional experiments by the skilled in the art, for example, nitrogen can flow into and purge an atomic layer deposition chamber at a flow rate of 5 slm under a pressure of 0.3 Torr.

In the step S205, as shown in FIG. 9~13, a first dielectric layer 250 is formed above the semiconductor substrate 200 to cover the first discrete compound monolayer 220.

The process for forming the dielectric layer on the semiconductor substrate 200 to cover the first discrete compound monolayer 220 can be any techniques well known to those skilled in the art, such as physical vapor deposition process, chemical vapor deposition process. In this embodiment, there is provided an atomic layer deposition process to form the first dielectric layer, which comprises the following steps:

(I) flowing a fifth precursor gas to the atomic layer deposition chamber to form a fifth monolayer above the semiconductor substrate and the first discrete compound monolayer, wherein the fifth monolayer fills the spacing in the first discrete compound monolayer;

(II) flowing an inert purge gas to the atomic layer deposition chamber to remove the fifth precursor gas that does not form the fifth monolayer above the semiconductor substrate and the first discrete compound monolayer;

(III) flowing a sixth precursor gas to the atomic layer deposition chamber to react with the fifth precursor gas that has formed the fifth monolayer, thereby forming a first dielectric mono-atomic layer;

(IV) flowing an inert purge gas to the atomic layer deposition chamber to remove the sixth precursor gas that does not form the first dielectric mono-atomic layer and the byproduct of the reaction between the fifth and the sixth precursor gases; and repeating the steps (I) to (IV) until the resulting first dielectric layer has a given thickness to cover the first discrete compound monolayer.

Figure 9:
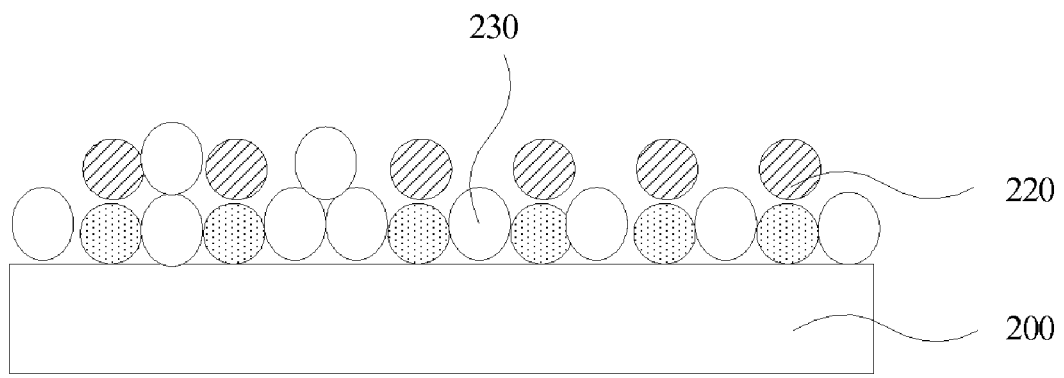

Referring to FIG. 9, the fifth precursor gas flows to the semiconductor substrate 200 in the atomic layer deposition chamber. Since the first discrete compound monolayer 220 has been formed on the semiconductor substrate 200, the fifth precursor gas forms a fifth monolayer 230 above the semiconductor substrate 200 and the first discrete compound monolayer 220; furthermore, due to the discrete distribution of the islands in the first discrete compound monolayer 220 on the semiconductor substrate 200, the third monolayer 230 on the semiconductor substrate 200 fills the spacing in the first discrete compound monolayer 220. The fifth precursor gas positioned on the first discrete compound monolayer 220 combines with the first discrete compound monolayer 220 via interatomic force or chemical bonds.

The fifth precursor gas can be any of the reaction gases that has nucleation matter in the prior art and can form the fifth monolayer on the semiconductor substrate and the first discrete compound monolayer 220 through chemical or physical adsorption. Furthermore, the fifth precursor gas can react with a sixth precursor gas to form insulation materials, such as silicon oxide, silicon nitride, and silicon oxynitride, etc.

For better understanding and implementing the invention by the skilled in the art, the embodiment provides several particular examples. If the final dielectric layer to be formed is $SiO_2$, the fifth precursor gas can be $Si(OC_2H_5)_4$, $SiH_2[NH(C_4H_9)]_2$, $SiH(OC_2H_5)_3$, $Si_2Cl_6$, or $SiHN[(CH_3)_2]_3$ and the like.

The process of the third precursor gas flowing to the semiconductor substrate in the atomic layer deposition chamber can be performed by any techniques in the prior art known to those skilled in the art.

Figure 10:
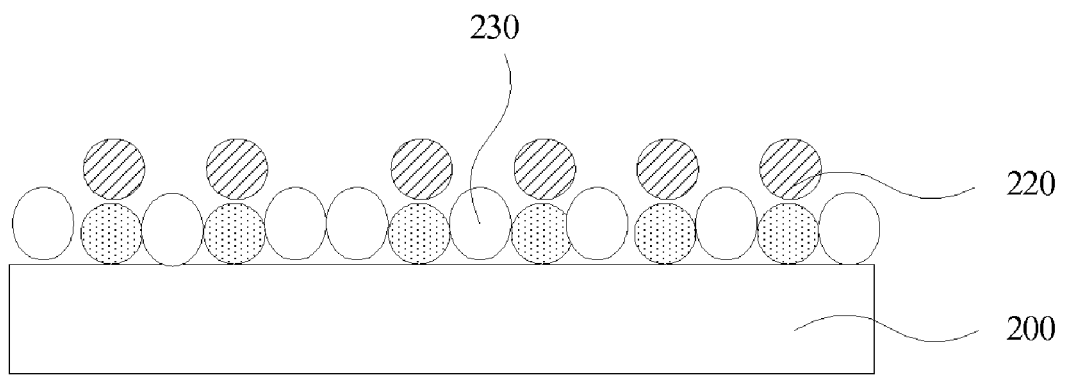

Referring to the FIG. 10, the inert purge gas flows to the semiconductor substrate 200 in the atomic layer deposition chamber to remove the fifth precursor gas which does not form the fifth monolayer on the semiconductor substrate 200 and the first discrete compound monolayer 220. The inert purge gas can be, foe example, He, Ne, Ar, and the like, and the process conditions of purging can be determined by those skilled in the art.

Figure 11:
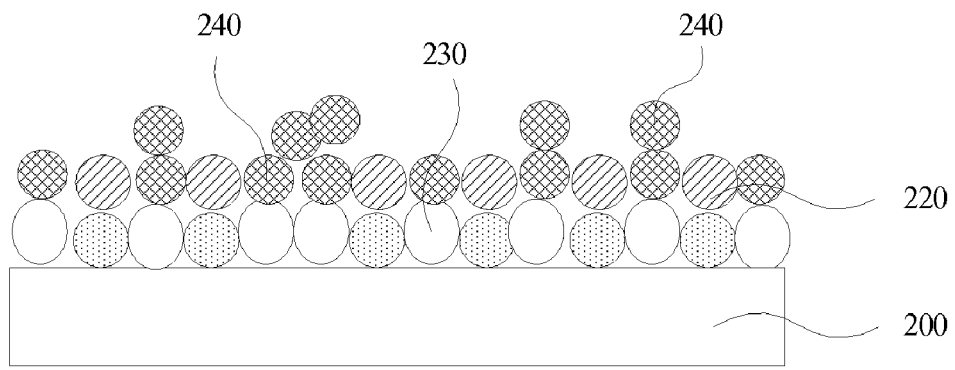

Referring to the FIG. 11, the sixth precursor gas flows to the semiconductor substrate in the atomic layer deposition chamber and reacts with the fifth precursor gas that has formed the fifth monolayer 230 to form a dielectric mono-atomic layer 240.

The fifth precursor gas forming the third monolayer 330 includes two portions, the first portion is that fills the spacing in the first discrete compound monolayer 220, and the second portion is that lies on the first discrete compound monolayer 220 and combines with the first portion via adsorption.

The sixth precursor gas reacts with the fifth precursor gas to form a dielectric mono-atomic layer 240, which can be a mono-atomic layer of insulation materials such as silicon oxide, etc.

In an illustrative example, if the final dielectric layer to be formed is $SiO_2$, the sixth precursor gas can be $NH_3$, $N_2O$, $N_2$ and the like.

The process of the sixth precursor gas flowing to the semiconductor substrate in the atomic layer deposition chamber can be performed by any techniques in the prior art known to those skilled in the art.

Figure 12:
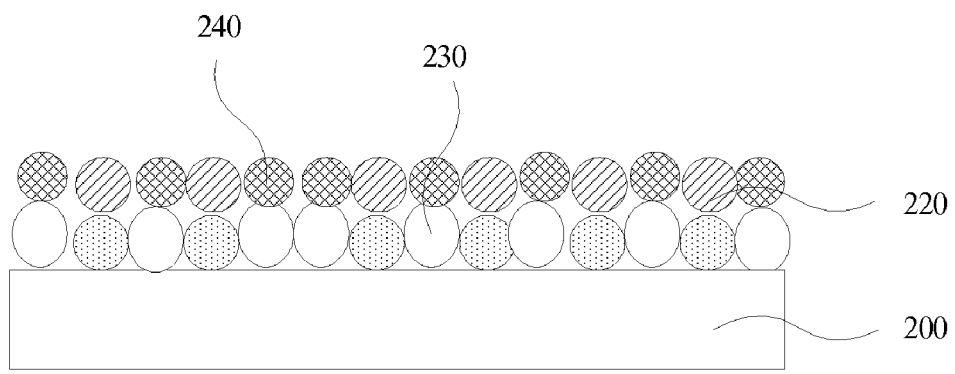

Referring to the FIG. 12, the inert purge gas flows to the semiconductor substrate in the atomic layer deposition chamber to remove the sixth precursor gas that does not form the dielectric mono-atomic layer 240 and the byproducts of the reaction between the fifth and the sixth precursor gases. The inert purge gas is He, Ne, Ar and the like, and the process conditions of purging can be determined by those skilled in the art.

Figure 13:
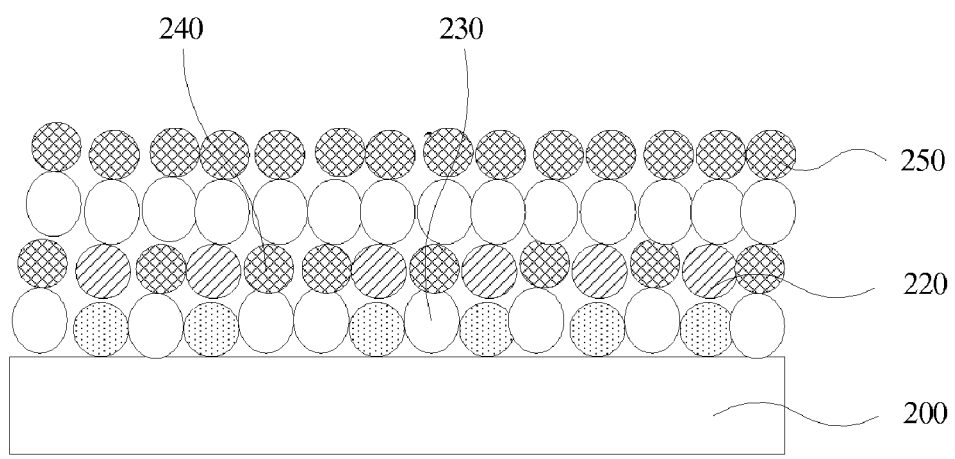
Figure 14:
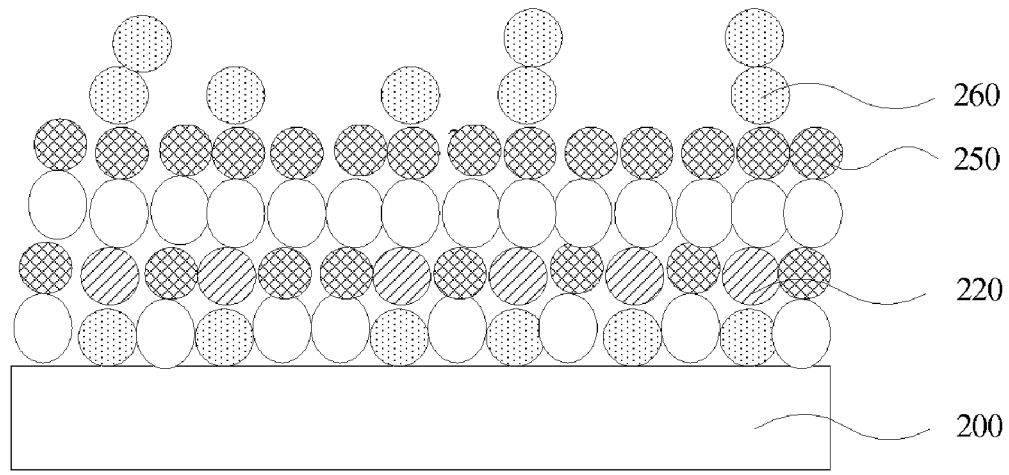

Referring to the FIG. 13, the deposition process of the dielectric mono-atomic layer is performed on the dielectric mono-atomic layer 240 one or more times again to form a first dielectric layer 250 having a given thickness to cover the discrete compound monolayer.

The process steps for continuously forming dielectric layers on the dielectric mono-atomic layer 240 are the same as the process steps described in the FIGS. 9-13. The embodiment provides a process for forming another dielectric mono-atomic layer on the dielectric mono-atomic layer, comprising the steps of:

1) flowing a seventh precursor gas to the semiconductor substrate in the atomic layer deposition chamber to form a seventh monolayer on the dielectric mono-atomic layer and the discrete compound monolayer, and the seventh monolayer covers the dielectric mono-atomic layer and the discrete compound monolayer, wherein, the seventh precursor gas is the same as the fifth precursor gas for forming the fifth monolayer, which comprises any of the reaction gases in the prior art that have nucleation matter and can form the seventh monolayer on the dielectric mono-atomic layer and the discrete compound monolayers through chemical or physical adsorption. Furthermore, the seventh precursor gas can react with a eighth precursor gas to form insulation materials, such as silicon oxide, silicon nitride, or silicon oxynitride etc.;

2) flowing an inert purge gas to the semiconductor substrate in the atomic layer deposition chamber to remove the seventh precursor gas that does not form the seventh monolayer on the dielectric mono-atomic layer and the discrete compound monolayer.

3) flowing a eighth precursor gas to the semiconductor substrate in the atomic layer deposition chamber to react with the seventh precursor gas which has formed the seventh monolayer, thereby forming another dielectric mono-atomic layer above the dielectric mono-atomic layer, wherein the eighth precursor gas is the same as the seventh precursor gas, and reacts with the seventh precursor gas to form a dielectric mono-atomic layer, which is a mono-atomic layer of insulation materials such as silicon oxide and the like.

4) flowing an inert purge gas to the semiconductor substrate in the deposition atomic layer chamber to remove the eighth precursor gas that does not form the dielectric mono-atomic layer and the by product of the reaction between the seventh and the eighth precursor gases.

Another dielectric mono-atomic layer is formed to cover the dielectric mono-atomic layer and the first discrete compound monolayer by the processes from step 1) to step 4).

If necessary, the processes of forming the dielectric mono-atomic layer can be repeatedly performed many times to obtain dielectric layers having desired thickness.

In the process described in the embodiment, after forming a first discrete compound monolayer, a dielectric layer is formed on the first discrete compound monolayer to cover and seal the first discrete compound monolayer. A second discrete compound monolayer can be further formed on the first dielectric layer to achieve one or more discrete compound monolayers.

Figure 15:
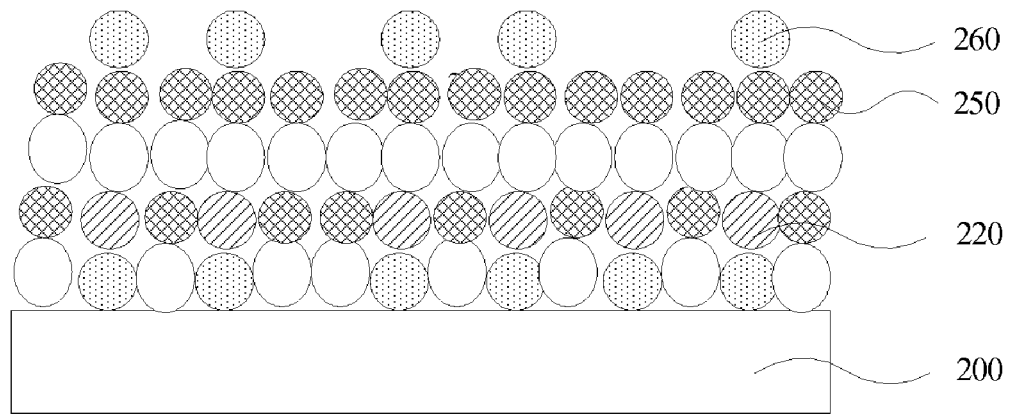

In the step S206, a third precursor gas flows to the first dielectric layer 250 in an atomic layer deposition chamber, as shown in FIG. 15, and a third discrete monolayer 260 is formed on the first dielectric layer 250 due to the physical or chemical adsorption between the third precursor gas and the first dielectric layer 250.

There is also adsorbed the atoms of the third precursor gas on the third monolayer 260 which is directly contacted with the first dielectric layer 250 due to the mutual adsorption between the atoms of the first precursor gas. Also, there is adsorbed the atoms of the third precursor gas on the first monolayer of the discrete atomic size islands 220.

The third precursor gas can be any of reaction gases having nucleation matter and capable of forming the third monolayer on the semiconductor substrate via chemical or physical adsorption. It can be selected from one or more of metal materials, semi-conductive materials, or metals coordinated with halogen and organic complex, or semiconductors coordinated with halogen and organic complex or mixtures thereof, for example, the metal materials include Ta, Ti, W, Mo, Nb, Cu, Ni, Pt, Ru, Me, Ni and Al etc., the semi-conductive materials include silicon etc., and the semiconductors coordinated with halogen and organic complex includes $SiCl_2H_2$, $Si(OC_2H_5)_4$, $SiH_2[NH(C_4H_9)]_2$, and $SiH(OC_2H_5)_3$ etc.

As an illustrative example, the embodiment provides several particular third precursor gases for well understanding and implementing the invention by those skilled in the art. If the final second discrete compound monolayer to be formed is $Si_3N_4$ layer, the third precursor gas is a reaction gas with Si atom nucleation matter, such as $SiCl_2H_2$, $SiH_4$, $Si_2Cl_6$ or $SiH_2[NH(C_4H_9)]_2$, etc.

If the final second discrete compound monolayer to be formed is HfO layer, the third precursor gas is a reaction gas with Hf atom nucleation matter, such as $Hf[N(CH_3)(C_2H_5)]_4$, $Hf[N(C_2H_5)_2]_4$, $Hf[OC(CH_3)_3]_4$, or $HfCl_4$, etc.

If the final second discrete compound monolayer to be formed is $Al_2O_3$ layer, the first precursor gas is a reaction gas with Al atom nucleation matter, such as $Al(CH_3)_3$, etc.

If the final second discrete compound monolayer to be formed is WN layer, the first precursor gas is a reaction gas with W atom nucleation matter, such as $WF_6$, etc.

In order to allow the third precursor gas to form the third discrete monolayer on the semiconductor substrate, the specific process conditions of the third precursor gas flowing to the deposition chamber may be controlled. The conditions controlling the discrete distribution of the third precursor gas on the semiconductor substrate include the gas flow rate, flowing time, flowing temperature, and pressure, etc. of the third precursor gas flowing into the atomic layer deposition chamber.

In this embodiment, the flow rate and flowing time of the third precursor gas flowing to the deposition chamber play a key role in achieving a discrete distribution. In order to allow the third precursor gas to form the third discrete monolayer on the semiconductor substrate, the flow rate and flowing time of the third precursor gas flowing to the deposition chamber should be reduced on the basis of the process of forming a dense third monolayer in prior art, and the flowing of the third precursor gas is ceased before the third precursor gas adsorbed on the semiconductor substrate forms a dense and continuous distribution layer. In a preferred example, the flow rate of the third precursor gas in the deposition chamber is greatly decreased while the flowing time is properly increased, thereby improving the controllability of the process.

In this embodiment, the distribution density of the third precursor gas which forms the third monolayer on the semiconductor substrate can be controlled by controlling the flow rate and flowing time of the third precursor gas flowing to the atomic layer deposition chamber.

In the prior art, as to different third precursor gases, the flow rate and flowing time required for forming a dense third monolayer on the semiconductor substrate are different; similarly, in the embodiment of present invention, as to different third precursor gases, the flow rate and flowing time required for forming a third discrete monolayer on the semiconductor substrate are different. However, the process of forming a third discrete monolayer according to the present invention is based on the process of forming a third dense monolayer in the prior art and is performed by reducing the flow rate and flowing time of the third precursor gas. In the process of forming a third discrete monolayer according to the present invention, the third monolayer with a discrete distribution can be formed depending on the requirement of process design, and the distribution density of the third precursor gas for forming the third discrete monolayer is controllable.

In the embodiment, there is provided a particular example for well implementing the invention by the skilled in the art. If the final second discrete compound monolayer to be formed is $Si_3N_4$, the third precursor gas $SiCl_2H_2$ is flowed into a conventional deposition apparatus, at a flow rate of 0.06~0.3 slm and for 0~10 sec, preferably 0~7 sec. The pressure under which the third precursor gas flows into the deposition chamber is 500-800 Pa, and the temperature in the deposition chamber is in a range of 450-600° C., preferably 550° C.

In another particular example, if the final second discrete compound monolayer to be formed is $Al_2O_3$, nitrogen gas carrying the liquid of $Al(CH_3)_3$ is flowed into a conventional atomic layer deposition apparatus as the third precursor gas, wherein the temperature of the nitrogen gas is 25° C., the flow rate of nitrogen gas is 0.03-0.15 slm, and the flowing time is more than 0, but less than 10 sec, preferably more than 0, but less than 7 sec. The pressure under which the third precursor gas flows into the deposition chamber is in a range of 3-5 Pa, and the temperature in the deposition chamber is in a range of 250-450° C., preferably 400° C.

In the step S207, as shown in FIG. 15, an inert purge gas flows to the semiconductor substrate in an atomic layer deposition chamber to remove the third precursor gas that does not form the third monolayer 260 on the first dielectric layer 250.

In this step, only the third precursor gas directly contacting the first dielectric layer 250 is remained, and the other third precursor gas which is not adsorbed on the first dielectric layer 250 directly is removed. The inert gas includes He, Ne, Ar, and the like.

After purging by the inert gas, the uniform or non-uniform third monolayer is formed on the first dielectric layer 250 with a mono-atomic discrete distribution.

The purging of the inert gas can be performed according to any of the conventional processes in the prior art. There is provided a particular example for implementing the invention by the skilled in the art, for example, nitrogen ($N_2$) gas flows into and purges the deposition chamber at a flow rate of 5 slm under a pressure of 0.3 Torr.

Figure 16:
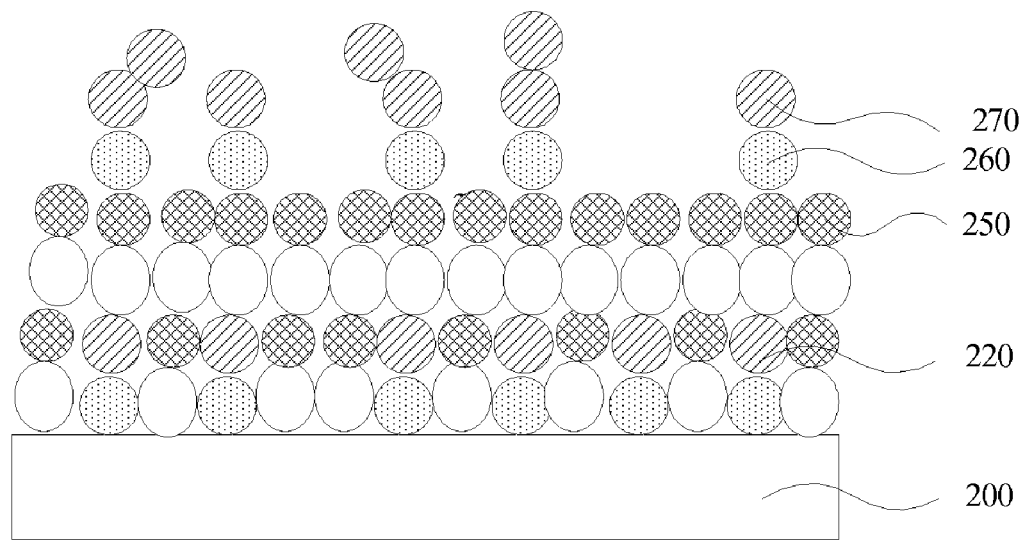

In step S208, as shown in FIG. 16, a fourth precursor gas flows to the semiconductor substrate in an atomic layer deposition chamber, and reacts with the third precursor gas which forms the third monolayer 260, thereby forming a second discrete compound monolayer 270. At the same time, due to the adsorption force between atoms, the fourth precursor gas can also be adsorbed on the first dielectric layer 250 and the second discrete compound monolayer 270. Due to the chemical reaction between the fourth precursor gas and the third precursor gas, by products may be generated from the reaction between the fourth precursor gas and the third precursor gas in the deposition chamber.

Depending on the second discrete compound monolayer to be formed and the third precursor gas, the fourth precursor gas can be any of the conventional substances in the prior art that can react with the third precursor gas to generate the second discrete compound monolayer.

In a particular example, the fourth precursor gas may be a material containing N or O or metal atoms and is used as a reductant or oxidant, such as $NH_3$ or $O_2$.

As an illustrative example only, the embodiment provides several particular fourth precursor gases for well understanding and implementing the invention by the skilled in the art. If the final second discrete compound monolayer to be formed is $Si_3N_4$, the third precursor gas is a reaction gas having Si atom nucleation matter, and the fourth precursor gas is a gas that can react with the nucleation matter of the third monolayer formed by the third precursor gas to form a second discrete compound monolayer, such as $NH_3$, $N_2O$, and $N_2$ and the like.

If the final second discrete compound monolayer to be formed is HfO, the third precursor gas is a reaction gas having Hf atom nucleation matter, and the fourth precursor gas may be the gas that can react with the nucleation matter of the third monolayer formed by the third precursor gas to form a second discrete compound monolayer, such as $O_3$ and the like.

If the final second discrete compound monolayer to be formed is $Al_2O_3$, the third precursor gas is a reaction gas having Al atom nucleation matter, and the fourth precursor gas may be the gas that can react with the nucleation matter of the third monolayer formed by the third precursor gas to form a second discrete compound monolayer, such as $H_2O$ or $O_3$ and the like.

If the final second discrete compound monolayer to be formed is WN, the third precursor gas is a reaction gas having W atom nucleation matter, and the fourth precursor gas can be, for example, $NH_3$ and the like.

The process of flowing the fourth precursor gas into the semiconductor substrate in the deposition chamber can be performed by any conventional techniques known to the skilled in the art. For example, when the third precursor gas is $SiCl_2H_2$ and the final discrete compound monolayer is $Si_3N_4$, $NH_3$ is used as the fourth precursor gas and injected into a conventional atomic layer deposition apparatus in the prior art at a flow rate of 2-5 slm for 0-30 sec, while the pressure in the deposition chamber is 30-50 Pa, and the temperature in the deposition chamber is 450-600° C., preferably 550° C.

In this embodiment, the first precursor gas, the second precursor gas, the third precursor gas and the fourth precursor gas all can be selected from the various conventional gases available in the atomic layer deposition process and known to those skilled in the art. In the specific examples provided in this embodiment, the first precursor gas may be the same as, or different from the third precursor gas, and the second precursor gas and the fourth precursor gas may also be the same or different form each other, so the first discrete compound monolayer and the second discrete compound monolayer may be the same or different form each other. Preferably, the chemical component of the first discrete compound monolayer is the same as that of the second discrete compound monolayer. In this embodiment, the first discrete compound monolayer and the second discrete compound monolayer can be made of silicon nitride, aluminium oxide, hafnium oxide, tungsten nitride and the like.

Figure 17:
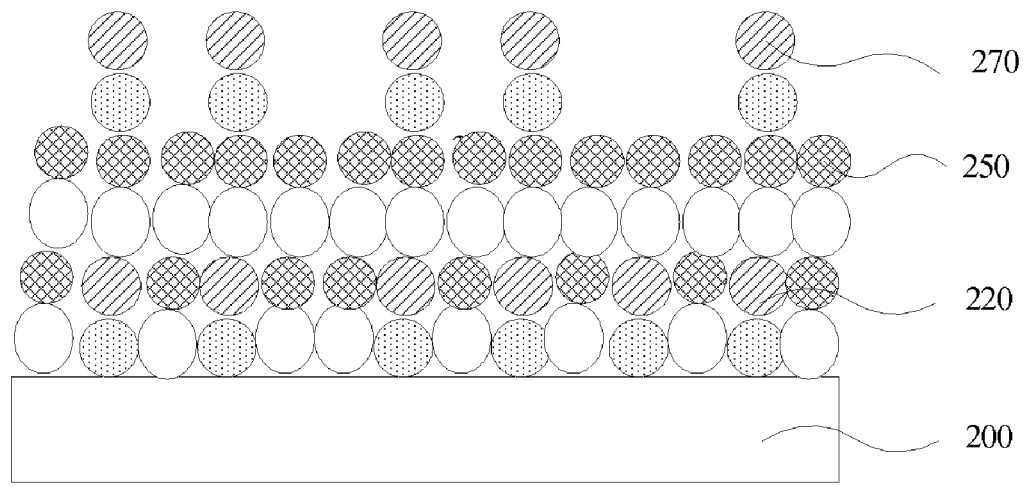

In the step S209, as shown in FIG. 17, an inert purge gas flows to the semiconductor substrate in the deposition chamber to remove the fourth precursor gas that does not react with the third precursor gas and the by product of the reaction between the third precursor gas and the fourth precursor gas. After purging by the inert gas, an second discrete compound monolayer 270 is formed on the first dielectric layer 250 with a mono-atomic discrete distribution.

Figure 18:
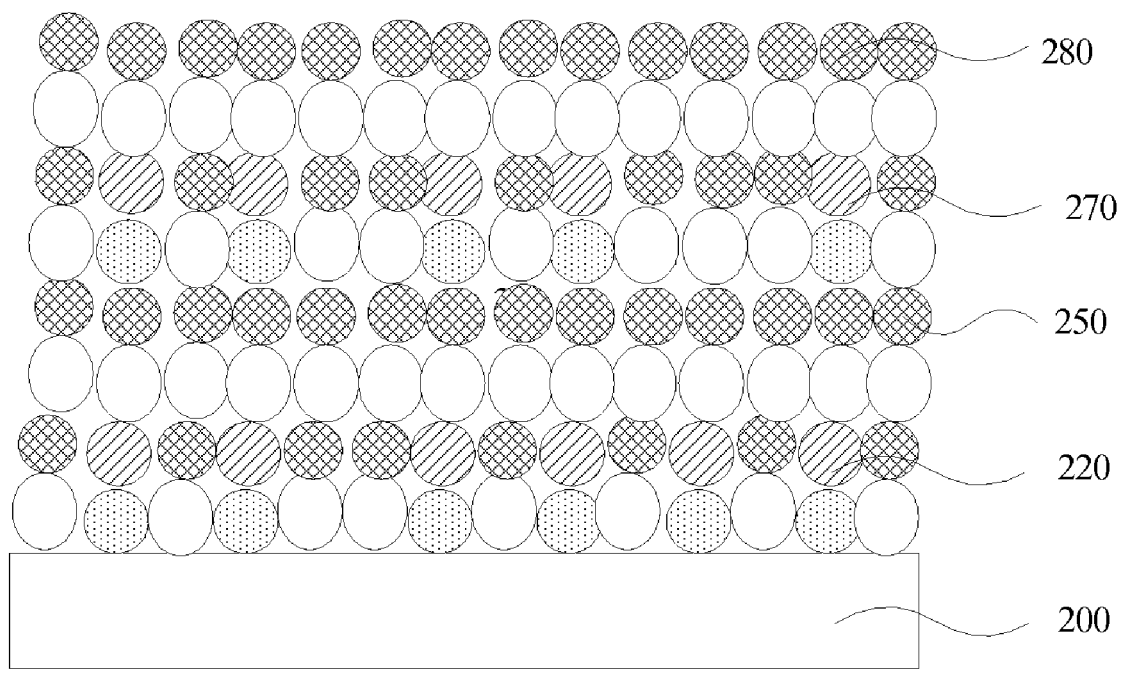

Finally, in the step S210, as shown in FIG. 18, a second dielectric layer 280 is formed above the first dielectric layer to cover the second discrete compound monolayer 270. The process for forming the second dielectric layer 280 can be performed by any techniques well known to those skilled in the art, such as physical vapor deposition process, chemical vapor deposition process and the like. In this embodiment, there is provided an atomic layer deposition process to form the second dielectric layer, which can refer to the process for forming the first dielectric layer.

If necessary, after the first discrete compound monolayer, the first dielectric layer, the second discrete compound monolayer and the second dielectric layer are formed above the semiconductor substrate, a third discrete compound monolayer may be formed on the second dielectric layer, and a third dielectric layer may be formed above the second dielectric layer to cover the third discrete compound monolayer; in the same way, a $(N+1)^{th}$ discrete compound monolayer may be formed on the $N^{th}$ dielectric layer, and a $(N+1)^{th}$ dielectric layer may be formed above the $N^{th}$ dielectric layer to cover the $(N+1)^{th}$ discrete compound monolayer, where the N is an integer no less than 3, so that a plurality of discrete compound monolayers and a plurality of dielectric layers covering respective discrete compound monolayer can be formed above the semiconductor substrate.

The process for forming the $(N+1)^{th}$ discrete compound monolayer can be the same as that for the first discrete compound monolayer or for the second discrete compound monolayer, also, the material of the $(N+1)^{th}$ discrete compound monolayer can be the same as that of the first discrete compound monolayer or for the second discrete compound monolayer.

One or more discrete compound monolayers can be formed above the semiconductor substrate by the atomic layer deposition process provided in the embodiment.

Second Embodiment

Figure 20:
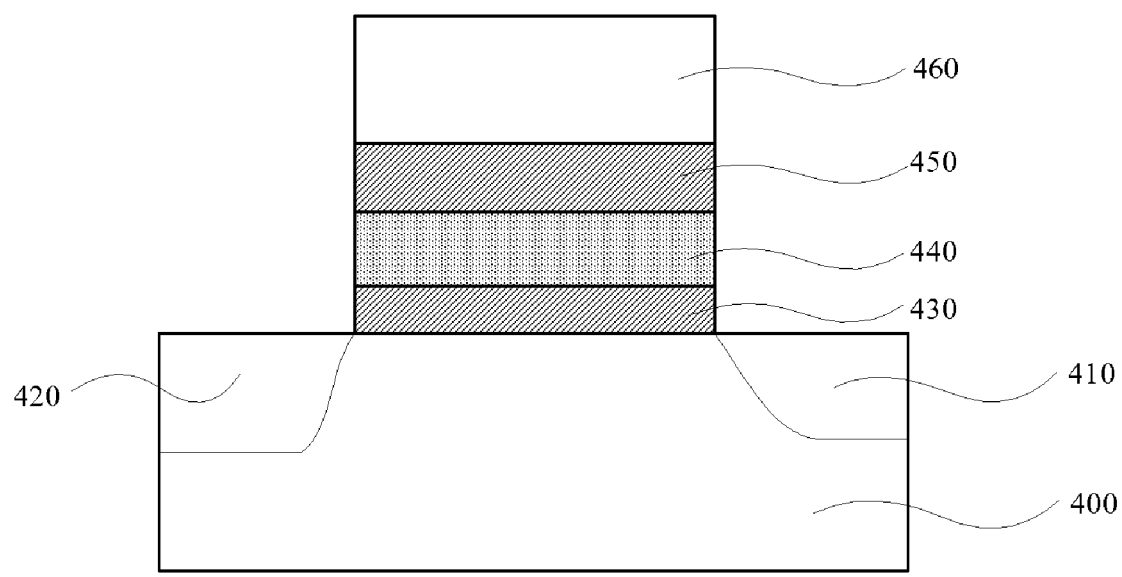
FIG. 20 is a schematic view illustrating a semiconductor device according to a second embodiment of the present invention.

As shown in FIG. 20, there is provided a semiconductor device in this embodiment, comprising a semiconductor substrate 400, a three layer stack structure of medium layer 430—charge trapping layer 440—medium layer 450 arranged on the semiconductor substrate 400, and a gate 460 arranged on the three layer structure, and a source 410 and a drain 420 arranged in the semiconductor substrate at either side of the three layer structure, wherein the charge trapping layer 440 is a dielectric layer containing one or more discrete compound monolayers formed by atomic layer deposition.

Here the word "containing" means that the one or more discrete compound monolayers are embedded in dielectric layers and covered by the same.

The semiconductor substrate 400 can include silicon(Si) or silicon germanium (SiGe) with monocrystal or polycrystal structure, ion-doped Si or SiGe such as N-doped or P-doped Si or SiGe, compound semiconductor such as silicon carbide, indium antimonide, lead telluride, indium arsenide, indium phosphide, gallium arsenide or gallium telluride, alloy semiconductor or combinations thereof, and silicon-on-insulator (SOI).

In the three layer stack structure, the medium layer 430 or 450 can be insulation material, such as $SiO_2$; the charge trapping layer 440 can be a dielectric layer containing one or more discrete compound monolayers, and the dielectric layer is made of insulation materials such as silicon oxide, silicon nitride, and silicon oxynitride; the discrete compound monolayer is sealed in dielectric layer having uniform or nonuniform atom distribution and forms discrete nano-dots; the monolayer can be any of the substance used for trapping charges in a charge trapping layer of a semiconductor device in the prior art, such as $SiO_2$, $Si_3N_4$, $Al_2O_3$, HfO, or WN.

The process for forming the dielectric layer containing one or more discrete compound monolayers is described in the embodiment 1.

The gate 460 can be a multilayer structure containing semiconductor materials, such as Si, Ge, metal or their combinations.

The source 410 and the drain 420 are located in the semiconductor substrate 400 at either side of the three layer stack structure. In the FIG. 20, the position of the source 410 and the drain 420 can be exchanged with each other, and the doping ions can be one or more of phosphorus ion, arsenic ion, boron ion, and indium ion.

In the semiconductor device provided by the embodiment, the charge trapping layer is a dielectric layer containing one or more discrete compound monolayers, the size of the islands is at atomic level and is controllable; furthermore, the distribution density of the discrete compound monolayers in the dielectric layer can be controlled through controlling the atomic layer deposition process for forming the discrete compound monolayer.

The present invention is capable of improving the density of the charge trapping well in the charge trapping layer and the charge trapping capability, even if the semiconductor device has a small line width.

While the present invention has been described with respect to certain preferred embodiments, it will be apparent to those skilled in the art that various changes and modifications may be made without departing from the spirit and scope of the invention as defined in the following claims.

The invention claimed is:

1. An atomic layer deposition method, comprising the steps of:
    placing a semiconductor substrate in an atomic layer deposition chamber;
    flowing a first precursor gas to the semiconductor substrate within the atomic layer deposition chamber to form a first discrete monolayer on the semiconductor substrate;
    flowing an inert purge gas to the semiconductor substrate within the atomic layer deposition chamber to remove the first precursor gas which does not form the first monolayer on the semiconductor substrate;
    flowing a second precursor gas to the atomic layer deposition chamber to react with the first precursor gas which forms the first monolayer, thereby forming a first discrete compound monolayer;

flowing an inert purge gas to the semiconductor substrate within the atomic layer deposition chamber to remove the second precursor gas which does not react with the first precursor gas and a byproduct of the reaction between the first and the second precursor gases;

forming a first dielectric layer to cover the first discrete compound monolayer on the semiconductor substrate, wherein the first dielectric layer is made of silicon oxide;

flowing a third precursor gas to the atomic layer deposition chamber to form a third discrete monolayer above first dielectric layer;

flowing an inert purge gas to the atomic layer deposition chamber to remove the third precursor gas which does not form the third monolayer with the first dielectric layer;

flowing a fourth precursor gas to the atomic layer deposition chamber to react with the third precursor gas which has formed the third monolayer, thereby forming a second discrete compound monolayer;

flowing an inert purge gas to the atomic layer deposition chamber to remove the forth precursor gas which does not react with the third monolayer and a byproduct of the reaction between the third and the forth precursor gases; and forming a second dielectric layer to cover the second discrete compound monolayer above the first dielectric layer.

2. The atomic layer deposition method in claim 1, further comprising forming a third discrete compound monolayer on the second dielectric layer; forming a third dielectric layer to cover the third discrete compound monolayer above the second dielectric layer; and in the same way, forming a $(N+1)^{th}$ discrete compound monolayer on the $N^{th}$ dielectric layer, and forming a $(N+1)^{th}$ dielectric layer to cover the $(N+1)^{th}$ discrete compound monolayer above the $N^{th}$ dielectric layer, where the N is an integer no less than 3.

3. The atomic layer deposition method in claim 1, wherein the first precursor is selected from one or more of metal, semiconductor, metal coordinated with halogen and organic complex, and semiconductor coordinated with halogen and organic complex, or mixtures thereof.

4. The atomic layer deposition method in claim 3, wherein the metal comprises Ta, Ti, W, Mo, Nb, Cu, Ni, Pt, Ru, Me, Ni or Al.

5. The atomic layer deposition method in claim 3 wherein the semiconductor is silicon.

6. The atomic layer deposition method in claim 3, wherein the metal coordinated with halogen and organic complex comprises $Al(CH_3)_3$, $Hf[N(CH_3)(C_2H_5)]_4$, $Hf[N(C_2H_5)_2]_4$, $Hf[OC(CH_3)_3]_4$, or $HfCl_4$, and the semiconductor coordinated with halogen and organic complex comprises $SiCl_2H_2$, $Si(OC_2H_5)_4$, $Si_2Cl_6$, $SiH_2[NH(C_4H_9)]_2$, or $SiH(OC_2H_5)_3$.

7. The atomic layer deposition method in claim 1, wherein when the first precursor is $SiCl_2H_2$, the first precursor flows to the semiconductor substrate in the atomic layer deposition chamber at a flow rate of 0.06~0.3 slm for 0~10 sec.

8. The atomic layer deposition method in claim 1, wherein the second precursor comprises $NH_3$, $N_2O$, $N_2$, $O_2$, $O_3$, or $H_2O$.

9. The atomic layer deposition method in claim 1, wherein the third precursor is selected from one or more of metal, semiconductor, metal coordinated with halogen and organic complex, and semiconductor coordinated with halogen and organic complex, or mixtures thereof.

10. The atomic layer deposition method in claim 9, wherein the metal comprises Ta, Ti, W, Mo, Nb, Cu, Ni, Pt, Ru, Me, Ni or Al.

11. The atomic layer deposition method in claim 9, wherein the semiconductor is silicon.

12. The atomic layer deposition method in claim 9, wherein the metal coordinated with halogen and organic complex comprises $Al(CH_3)_3$, $Hf[N(CH_3)(C_2H_5)]_4$, $Hf[N(C_2H_5)_2]_4$, $Hf[OC(CH_3)_3]_4$, or $HfCl_4$, and the semiconductor coordinated with halogen and organic complex comprises $SiCl_2H_2$, $Si(OC_2H_5)_4$, $Si_2Cl_6$, $SiH_2[NH(C_4H_9)]_2$, or $SiH(OC_2H_5)_3$.

13. The atomic layer deposition method in claim 9, wherein when the third precursor is $SiCl_2H_2$, the third precursor flows to the semiconductor substrate in the atomic layer deposition chamber at a flow rate of 0.06~0.3 slm for 0~10 sec.

14. The atomic layer deposition method in claim 1, wherein the fourth precursor gas comprises $NH_3$, $N_2O$, $N_2$, $O_2$, $O_3$, or $H_2O$.

15. The atomic layer deposition method in claim 1, wherein the process for forming the first dielectric layer is an atomic layer deposition process.

16. The atomic layer deposition method in claim 15, wherein the process for forming the first dielectric layer comprises the following steps:

(I) flowing a fifth precursor gas to the atomic layer deposition chamber to form a fifth monolayer above the semiconductor substrate and the first discrete compound monolayer, wherein the fifth monolayer fills the spacing in the first discrete compound monolayer;

(II) flowing an inert purge gas to the atomic layer deposition chamber to remove the fifth precursor gas that does not form the fifth monolayer above the semiconductor substrate and the first discrete compound monolayer;

(III) flowing a sixth precursor gas to the atomic layer deposition chamber to react with the fifth precursor gas that has formed the fifth monolayer, thereby forming a first dielectric monoatomic layer;

(IV) flowing an inert purge gas to the atomic layer deposition chamber to remove the sixth precursor gas that does not form the first dielectric monoatomic layer and the byproduct of the reaction between the fifth and the sixth precursor gases; and repeating the steps (I) to (IV) until the resulting first dielectric layer has a given thickness to cover the first discrete compound monolayer.

* * * * *